(12) United States Patent
Takasaki et al.

(10) Patent No.: US 7,651,881 B2
(45) Date of Patent: Jan. 26, 2010

(54) SOLID-STATE IMAGING DEVICE AND METHOD FOR MANUFACTURING THE SAME

(75) Inventors: Kosuke Takasaki, Kanagawa (JP); Kazuhiro Nishida, Kanagawa (JP); Kiyofumi Yamamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1036 days.

(21) Appl. No.: 10/807,348

(22) Filed: Mar. 24, 2004

(65) Prior Publication Data

US 2004/0189855 A1  Sep. 30, 2004

(30) Foreign Application Priority Data

Mar. 25, 2003  (JP) ............................. 2003-083446
Sep. 11, 2003  (JP) ............................. 2003-320271

(51) Int. Cl.
*H01L 21/00* (2006.01)

(52) U.S. Cl. .............................. 438/64; 438/68; 438/75; 438/106

(58) Field of Classification Search .................. 438/55, 438/64, 75, 68, 106, 455, 458
See application file for complete search history.

(56) References Cited

U.S. PATENT DOCUMENTS

| | | | | |
|---|---|---|---|---|
| 5,523,608 A * | 6/1996 | Kitaoka et al. | ............... | 257/433 |
| 6,027,958 A * | 2/2000 | Vu et al. | ...................... | 438/110 |
| 6,057,597 A * | 5/2000 | Farnworth et al. | ........... | 257/710 |
| 6,114,188 A * | 9/2000 | Oliver et al. | ................. | 438/107 |
| 6,169,319 B1 * | 1/2001 | Malinovich et al. | ......... | 257/447 |
| 6,266,872 B1 * | 7/2001 | Fjelstad | ........................ | 29/832 |
| 6,313,525 B1 * | 11/2001 | Sasano | ........................ | 257/704 |
| 6,492,195 B2 * | 12/2002 | Nakanishi et al. | ............ | 438/106 |
| 6,531,334 B2 * | 3/2003 | Sasano | ............................ | 438/64 |
| 6,555,417 B2 * | 4/2003 | Spooner et al. | .............. | 438/113 |
| 6,620,649 B2 * | 9/2003 | Uchida | ......................... | 438/107 |
| 6,777,767 B2 * | 8/2004 | Badehi | ......................... | 257/432 |
| 6,798,053 B2 * | 9/2004 | Chiu | ............................ | 257/684 |
| 6,858,518 B2 * | 2/2005 | Kondo | ........................... | 438/458 |
| 6,887,650 B2 * | 5/2005 | Shimoda et al. | .............. | 430/311 |
| 6,930,327 B2 * | 8/2005 | Maeda et al. | .................. | 257/59 |
| 6,946,366 B2 * | 9/2005 | Spooner et al. | .............. | 438/460 |
| 7,001,797 B2 * | 2/2006 | Hashimoto | ................... | 438/113 |
| 7,144,745 B2 * | 12/2006 | Badehi | ............................ | 438/7 |
| 2002/0096743 A1 * | 7/2002 | Spooner et al. | .............. | 257/620 |
| 2004/0016983 A1 * | 1/2004 | Misawa | ....................... | 257/433 |

(Continued)

FOREIGN PATENT DOCUMENTS

EP  1 387 397 A2  2/2004

(Continued)

*Primary Examiner*—Charles D Garber
*Assistant Examiner*—Stanetta D Isaac
(74) *Attorney, Agent, or Firm*—Sughrue Mion, PLLC

(57) ABSTRACT

A transfer film, on which an adhesive is applied, is glued to plural spacers formed on a glass substrate. The glass substrate is laid on a working table, and one end of the transfer film is fixed to a winding roller. A peeling guide is set at a position over the transfer film. The winding roller is driven to wind the transfer film while the working table moves horizontally. While winding the transfer film, the angle between the glass substrate and the transfer film is kept constant. After the transfer film is peeled off, the adhesive is uniformly transferred to each of the spacers.

17 Claims, 13 Drawing Sheets

U.S. PATENT DOCUMENTS

| | | | |
|---|---|---|---|
| 2004/0161871 A1* | 8/2004 | Omori | 438/68 |
| 2004/0164981 A1* | 8/2004 | Fujita et al. | 345/418 |
| 2005/0102827 A1* | 5/2005 | Tseng et al. | 29/832 |
| 2005/0106839 A1* | 5/2005 | Shimoda et al. | 438/458 |
| 2005/0170614 A1* | 8/2005 | Patel et al. | 438/460 |

FOREIGN PATENT DOCUMENTS

| | | |
|---|---|---|
| JP | 2001351997 A | 12/2001 |
| JP | 2002-231921 A | 8/2002 |
| JP | 2002289718 A | 10/2002 |

* cited by examiner

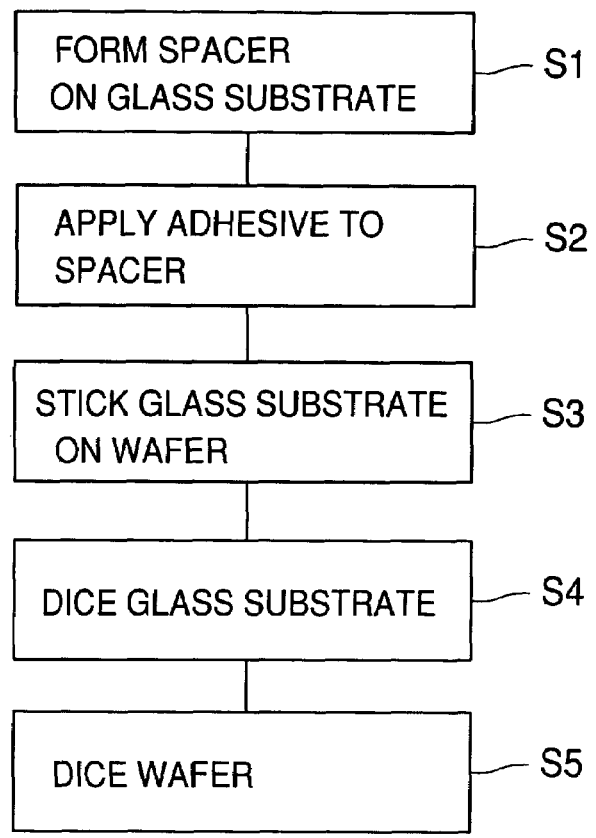
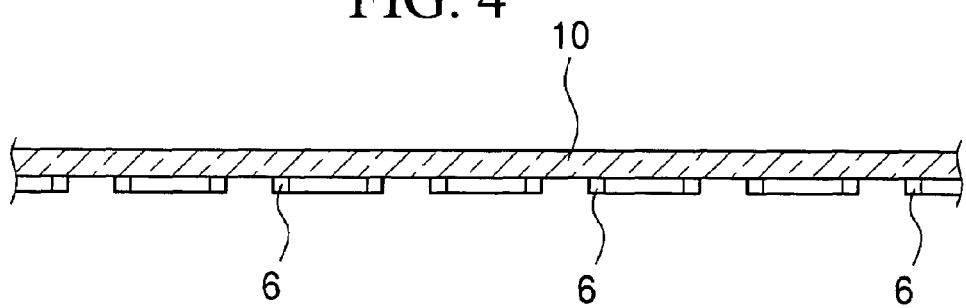

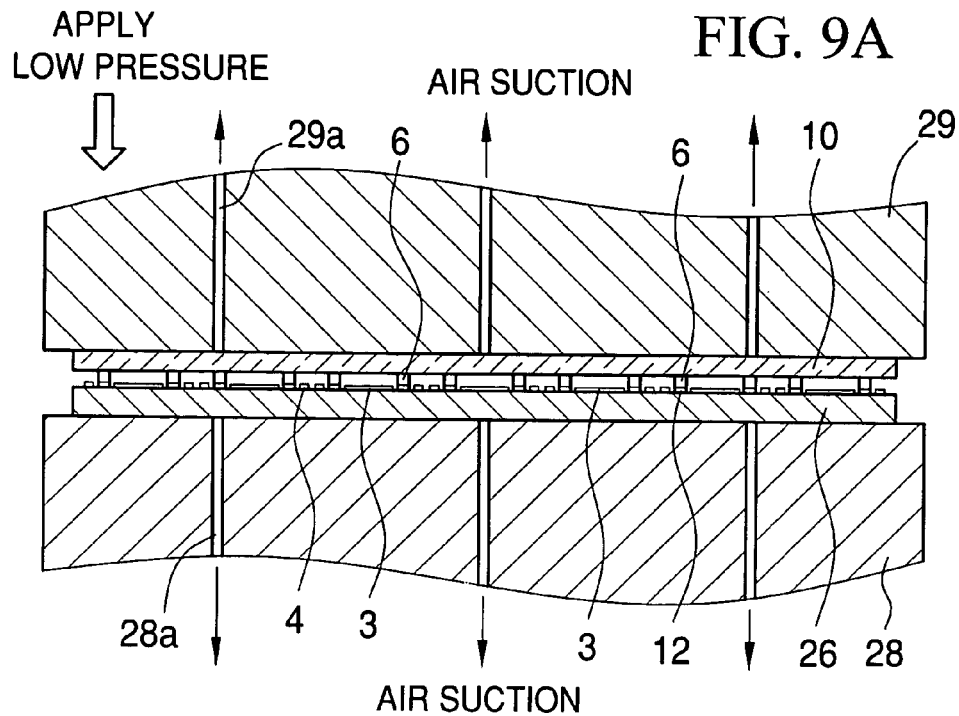
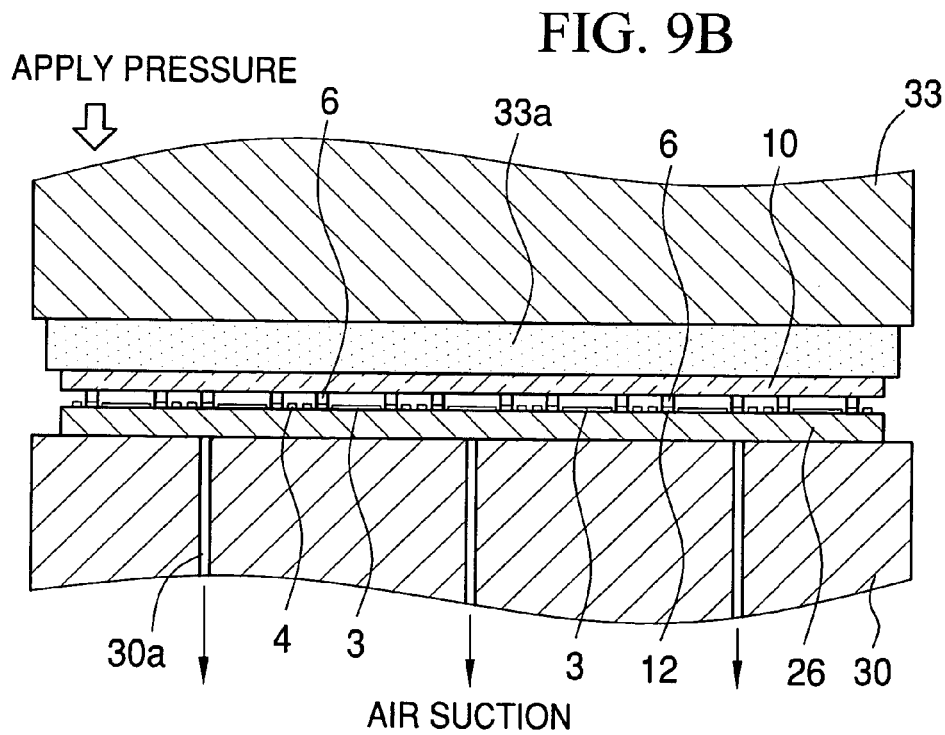

SOLID-STATE IMAGING DEVICE AND METHOD FOR MANUFACTURING THE SAME

BACKGROUND OF THE INVENTION

1. Field of the Invention

The present invention relates to a method for manufacturing a solid-state imaging device by use of wafer level chip size packaging technique, and a solid-state imaging device manufactured by such manufacturing method.

2. Description of the Related Art

Digital cameras, equipped with a solid-state imaging device and a semiconductor memory device, are widely spread among consumers. In addition, small electric apparatus, such as a mobile phone and a personal digital assistance (PDA), has the solid-state imaging device and the memory device to enable digital photography. A conventional solid-state imaging device is manufactured by the following steps. First, a solid-state imaging element chip, such as a charge coupled device (CCD) formed on a wafer, is die-bonded on a package formed from a ceramic, for instance. Then, after the terminals of the solid-state imaging element chip and the terminals of the package are electrically connected by bonding wires, a glass lid formed from a transparent glass is fixed to the package to seal the solid-state imaging element chip.

Small solid-state imaging device is preferable in terms of miniaturizing the digital camera and the small electric apparatus. As for an example to reduce the size of the solid-state imaging device, a wafer level chip size packaging technique (hereinafter referred to as "wafer level CSP") can package the solid-state imaging device without the packaging material. For instance, Japan Patent Laid-Open Publication (JP-A) No. 2002-231921 describes the solid-state imaging device, manufactured by the wafer level CSP technique, in which a spacer is bonded to the peripheral area of the upper surface of the solid-state imaging element chip. The cover glass is provided on the spacer to seal the solid-state imaging element chip. The solid-state imaging element chip has connection terminals on the upper, bottom or lateral surface.

In manufacturing the solid-state imaging device by the wafer level CSP technique, plural spacers are formed on the glass substrate as the cover glass. Then, after adhesives are applied to the edge surface of the spacers, the glass substrate is adhered to a wafer on which plural solid-state imaging element chips are formed. The wafer with the glass substrate is subject to dicing process to manufacture the solid-state imaging device.

It is necessary to provide a space between the solid-state imaging element and the spacer for the purpose of preventing flare that is caused by entering incident light, reflected on the inner surface of the spacer, into the solid-state imaging element. Moreover, since the spacer is pressed onto the solid-state imaging device to generate a stress during the bonding process, the spacer and the solid-state imaging device are distorted. Thus, the space between the solid-state imaging element and the spacer is necessary for preventing such distortion to the solid-state imaging device. Furthermore, because the solid-state imaging element generates much heat when the solid-state imaging device is operated at a high clock rate or takes an image for a long exposure time, the difference in thermal expansion rate between the solid-state imaging element chip and the spacer causes stress. The space between the solid-state imaging element and the spacer is necessary to prevent such stress from affecting the solid-state imaging element.

In bonding the spacer to the wafer, if the adhesives are flowed on the solid-state imaging element chip, the solid-state imaging device does not work properly because of noise interference caused by the flowed adhesive. Moreover, if the gap between the spacer and the wafer is not tightly sealed, the solid-state imaging device is damaged by cooling water during the dicing process. Thus, in order to increase productivity, the spacer must be tightly bonded to the wafer.

For the purpose of proper bonding, the adhesives applied on the spacer must be thin and uniform in thickness over the applied area. Although a small amount of adhesive with high viscosity is dropped on the spacer by potting method according to the above publication, putting the adhesives on the spacer having the width less than 200 µm is technically difficult. Even if the spacer has the width more than 200 µm, dropping the adhesives on all bonded surfaces of the plural spacers takes too much time for the adhering process.

In addition the above publication describes a method to apply the adhesive to the spacer by printing, but printing the adhesive is hardly realized because it is difficult to control the thickness and the position of the adhesive to be printed on the spacer. Moreover, silicon spacer tends to repel the adhesive, so it is also difficult to control the thickness and flatness of the adhesives to be put on the spacer.

In order to bond the spacer properly to the wafer, the width of the frame-shaped spacer is necessary to be considered. If the width of the spacer is too large, an improper bonding will happen because of air remaining inside the adhesive. Moreover, large width spacer will make it difficult to decrease the size of the solid-state imaging device. Thus, the manufacture cost will increase because of the small number of solid-state imaging devices per wafer. On the other hand, if the width of the spacer is too narrow, the solid-state imaging device will be physically weak.

For the purpose of preventing the adhesive from flowing into the solid-state imaging element, it is effective to lengthen the distance between the solid-state imaging element and the spacer. Making the distance longer, however, will increase the manufacture cost because of difficulty in miniaturizing the solid-state imaging device.

SUMMARY OF THE INVENTION

An object of the present invention is to provide a method for manufacturing a solid-state imaging device that is capable of bonding the spacers properly to the solid-state imaging elements on the wafer.

Another object of the present invention is to provide a solid-state imaging device that is manufactured by such manufacturing method.

To achieve the above object, the solid-state imaging device is manufactured by use of a transfer member to transfer an adhesive to a frame-shaped spacer to be bonded to a wafer on which plural solid-state imaging elements area formed. The spacers are formed in a transparent substrate, and each of the spacers surrounds the solid-state imaging element. The transfer member, which the adhesive is applied to, is stuck to the spacers. After applying the pressure to the transparent substrate and the transfer member, the transfer member is released from the transparent substrate to transfer the adhesive layer on the spacer.

The transfer member may be a rigid body such as a glass plate. It is also possible to form the transfer member from an elastic body, such as a flexible plastic film. The flexible film as the transfer member is preferably peeled off in such a manner that the angle between the transfer member and the transparent substrate is kept constant. The transfer member may have a ridge pattern or a recess pattern that is the same pattern as the spacers in the transparent substrate. It is also possible to apply a release agent, such as silicon, on the surface of the transfer member.

It is possible to carry out surface modification to the surface of the spacer to which the adhesive of the transfer member is to be contacted. The viscosity of the adhesive is preferably 0.1 Pa·s or more. The adhesive is applied to the transfer member by bar coating, blade coating or spin coating. In addition, it is preferable to apply air pressure or roller pressure to the transfer member and the transparent substrate.

The viscosity of the adhesive at the time of transferring to the spacer is preferably 100 Pa·s to 10000 Pa·s. The thickness of the adhesive is 0.5 µm to 5 µm when the adhesive is activated. The spacer may be bonded to the wafer over the surface to which the adhesive is applied.

The solid-state imaging device, manufactured by the above methods, may have the following features. The solid-state imaging element and the inner surface of the spacer are separated by 50 µm to 100 µm over the whole edge of the solid-state imaging element. The width of the spacer is 100 µm to 500 µm. It is possible to form chamfer edges in the surface of the spacer to which the adhesive is applied. The surplus of the adhesive is contained in the space between the wafer and the chamfer edges.

According to the present invention, since the adhesive is applied to the spacer by use of the transfer member with the adhesive, it is possible to apply thin adhesive on spacers evenly at a desired thickness. Thereby, the spacers are bonded properly to the wafer without forming a gap therebetween. It is also possible to prevent the adhesive from being flowed to the solid-state imaging element.

A rigid body having high flatness as the transfer member makes it possible to control the thickness of the adhesive. By using an elastic body as the transfer member, the transfer member is deformed to fit the surface of the spacers. Thus, it is possible to facilitate precise control of the thickness of adhesive, without an effect by the difference in height of the spacers and the transparent substrate. Moreover, since the angle between the transfer member and the transparent substrate is kept constant while the transfer member is peeled off, it is possible to increase the uniformity of the adhesive on the spacers.

By forming a ridge pattern that is the same as the pattern of the spacers on the transfer member, it is possible to ensure to contact of the transfer member to the spacers. On the other hand, a recess pattern, which is the same as the pattern of the spacers, makes it possible to control the thickness of the adhesive by adjusting the depth of the recess.

A release agent on the surface of the transfer member increases the peelability of the adhesive, so the thickness of the adhesive on the spacer may be the same as the thickness of the adhesive on the transfer member. Moreover, since surface modification to the spacer increases the wettability to the adhesive, it is possible to apply the adhesive uniformly.

When the adhesive is applied to the transfer member, the viscosity of the adhesive is low (0.1 Pa·s or more). Thus, it is possible to control the thickness of the adhesive easily. Since the adhesive is applied to the transfer member by bar coating, blade coating or spin coating, it is possible to apply the adhesive evenly with high precision at a low cost. Moreover, the transfer member and the transparent substrate are uniformly pressed to each other over the whole bonded surfaces by air pressure or roller pressure.

By increasing the viscosity of the adhesive into 100 Pa·s to 10000 Pa·s at the time to transfer the adhesive to the spacer, it is possible to prevent the adhesive from being flowed out, and thus to handle the transfer member and the transparent substrate easily at the time of bonding. Since the thickness of the adhesive is 0.5 µm to 5 µm when the adhesive is activated, it is possible to reduce the amount of the adhesive to be flowed out of the spacer after bonding to the wafer. Such thickness of the adhesive does not generate a gap between the spacer and the wafer. Moreover, since the spacer is bonded to the wafer over the surface to which the adhesive is applied, it is possible to control the bonding strength by choosing the thickness of the spacer.

The solid-state imaging element and the inner surface of the spacer are separated by 50 µm to 100 µm over the whole edge of the solid-state imaging element, so the flowed adhesive does not reach the solid-state imaging element. In addition, incident light reflected on the inner surface of the spacer does not reach the solid-state imaging element. Moreover, it is possible to reduce the influence of the stress in the bonded interface between the wafer and the spacer and the thermal stress caused by solid-state imaging element.

Since the width of the spacer is 100 µm to 500 µm, it is possible to ensure even application of the adhesive. Moreover, it is possible to increase the strength of the spacer while preventing the increase in manufacture cost.

The surplus adhesive is contained in the space between the wafer and the chamfer edges formed in the surface of the spacer to which the adhesive is applied, so the flowed adhesive does not reach the solid-state imaging element.

BRIEF DESCRIPTION OF THE DRAWINGS

The above objects and advantages of the present invention will become easily understood by one of ordinary skill in the art when the following detailed description would be read in connection with the accompanying drawings, in which:

FIG. 3 is a flow chart showing the steps to manufacture the solid-state imaging device;

FIG. 4 is a partial cross section of a glass substrate according to the manufacture step S1, in which plural spacers are formed in the glass substrate;

FIGS. 9A and 9B are partial cross sections to illustrate the step S3 to bond the glass substrate to the wafer;

PREFERRED EMBODIMENTS OF THE INVENTION

Figure 1:
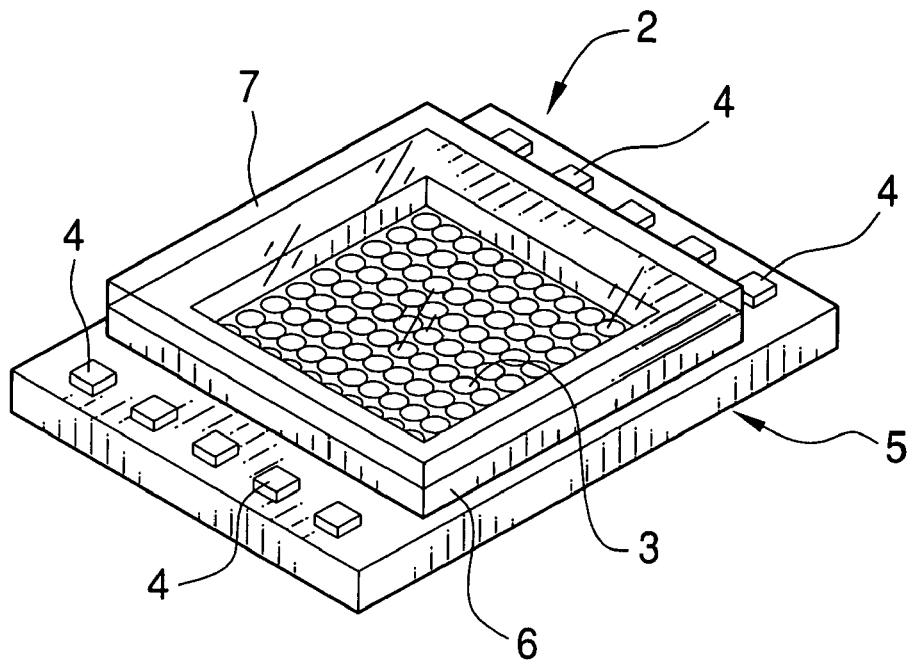
FIG. 1 is a perspective view of a solid-state imaging device manufactured by the method according to the present invention.
Figure 2:
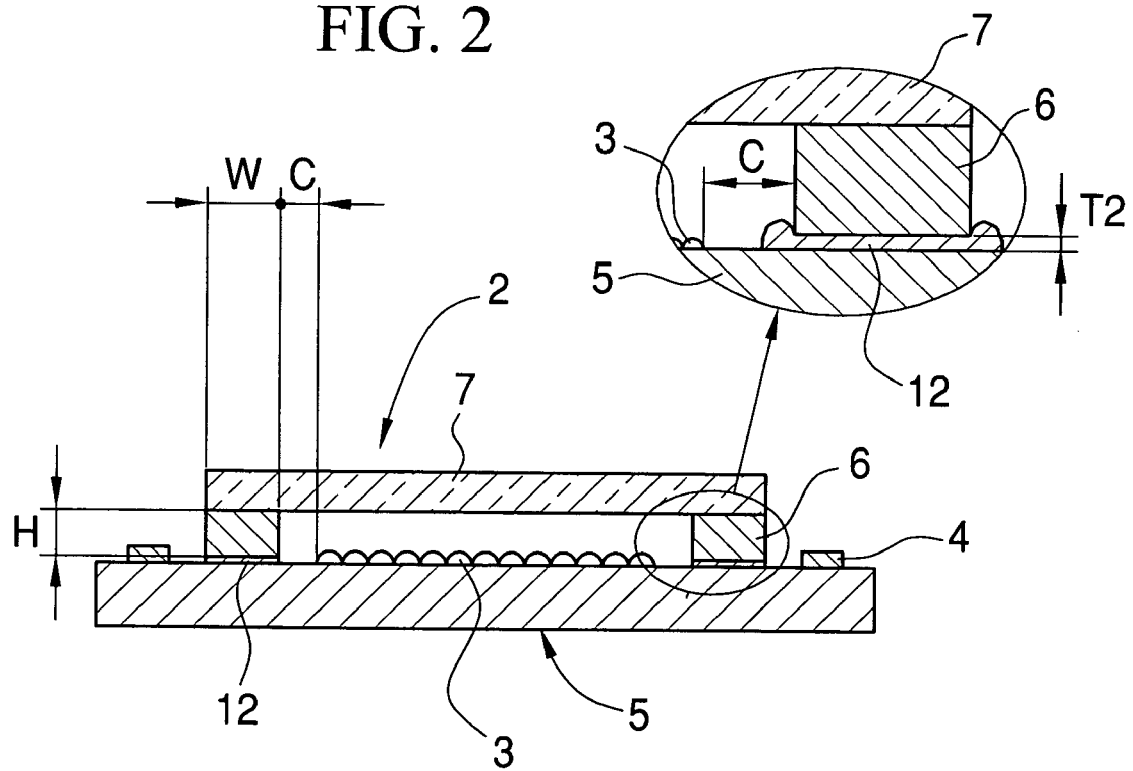
FIG. 2 is a partial cross section of the solid-state imaging device.

FIGS. 1 and 2 respectively show the perspective and partial cross section of a solid-state imaging device of the wafer level CPS structure that is manufactured by the method according to the present invention. The solid-state imaging device 2 comprises a solid-state imaging element 3, a rectangular-shaped solid-state imaging element chip 5, a frame-shaped spacer 6 and a cover glass 7. The solid-state imaging element 3 is coupled to the solid-state imaging element chip 5 via plural terminals 4 formed on the solid-state imaging element chip 5. The spacer 6, bonded to the solid-state imaging element chip 5, surrounds the solid-state imaging element 3. The cover glass 7 is provided on the spacer 6 to seal the solid-state imaging element 3. The cover glass 7 is made from a transparent α-ray shielding glass for the purpose of protecting the photo-diodes of the CCD.

An example of the solid-state imaging element 3 is a charge coupled device (CCD). There are color filters and micro lenses on the CCD. The terminals 4 are formed on the solid-state imaging element chip 5 by printing a conductive material. Circuit patterns between the terminals 4 and the solid-state imaging element 3 are also formed by printing. After forming the solid-state imaging element 3 and the terminals 4 on a wafer, the solid-state imaging element chips 5 are separated by dicing process.

The spacer 6 is formed from an inorganic material such as silicon. The width W of the spacer 6 is 100 μm to 500 μm, for instance. The height H of the spacer 6 is, for instance, 10 μm to 500 μm, and preferably 80 μm to 120 μm. An adhesive 12 to bond the solid-state imaging element chip 5 and the spacer 6 has a thickness T2 of 0.5 μm to 5 μm.

A frame-shaped surrounding area C is provided between the inner surface of the spacer 6 and the edge of the solid-state imaging element chip 5. The surrounding area C surrounds the whole edge of the solid-state imaging element chip 5 for the purpose of preventing incident light reflected on the inner surface of the spacer 6 from entering the solid-state imaging element chip 5. The surrounding area C is also effective in order not to affect the stress, generated at the interface between the solid-state imaging element chip 5 and the spacer 6, to the solid-state imaging element 3. Such stress is generated when a glass substrate having spacers 6 is pressed to the wafer as the base material of the solid-state imaging element chips 5 in bonding the spacer 6. Because the solid-state imaging element generates much heat when the solid-state imaging device 3 is operated at a high clock rate or takes an image for a long exposure time, such stress is also generated because of the difference in thermal expansion rate of the spacer 6 and the solid-state imaging element chip 5.

The solid-state imaging device 2 is manufactured by the steps according to the flow chart of FIG. 3. In the first step S1, plural spacers 6 are formed on a glass substrate 10 used as the cover glass 7, as shown in FIG. 4. The spacers 6 are formed by the following method, for example. First, an inorganic material film, composed of an inorganic material such as silicon, is layered on the glass substrate 10 by application technique such as spin coating, or by chemical vapor deposition (CVD). Then, plural spacers 6 are formed from the inorganic material film by photo lithography, development, etching and so forth. The inorganic material film may be formed on the glass substrate 10 by bonding a silicon wafer to the glass substrate 10. Alternatively, an inorganic material may be directly printed on the glass substrate 10 to form the spacer 6.

Figure 5:
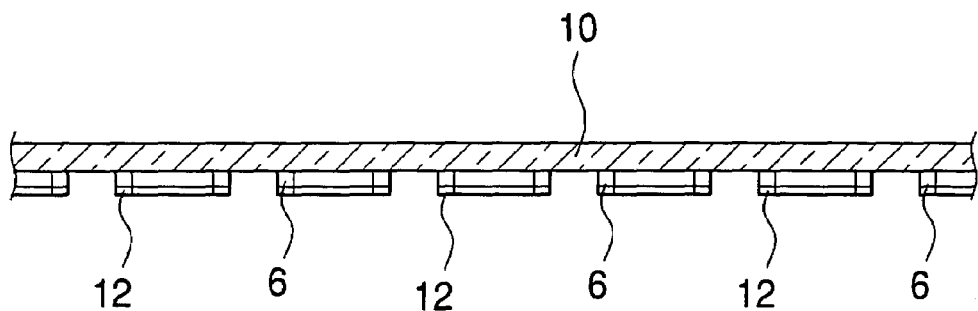
FIG. 5 is a partial cross section of the glass substrate according to the manufacture step S2, in which adhesive is applied to the spacers.
Figure 6:
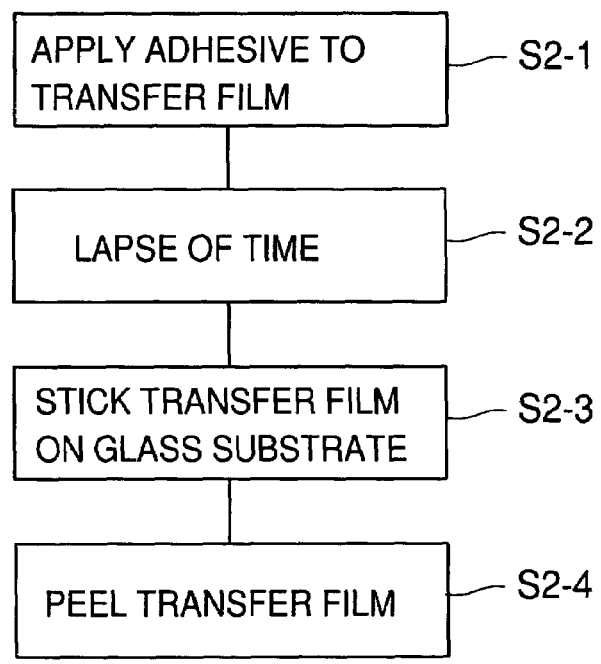
FIG. 6 is a flow chart showing the sequence of the manufacture step S2.

As shown in FIG. 5, a thin adhesive 12 is uniformly applied on edge surfaces of the spacer 6, to be glued to the wafer, on the glass substrate 10. The adhesive 12 for gluing the spacer 6 to the wafer is required to prevent deformation upon activation, and to keep in water-tight manner. Examples of the adhesives 12 are room-temperature activated adhesives of epoxy resins, silicon resins, and so forth. For the purpose of controlling the thickness in application, the adhesives 12 preferably have viscosity V1 about 0.1 Pa·s to 10 Pa·s. Other types of adhesives, such as UV activated adhesives, visible light activated adhesives and heat activated adhesives, may be used as the adhesive 12, if these adhesives yield the same effect.

Figure 7A:
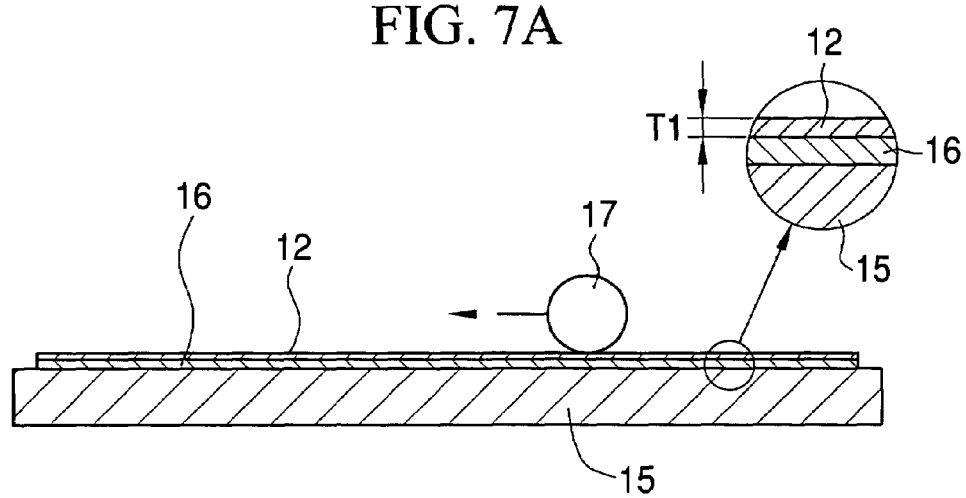
FIGS. 7A and 7B are explanatory views to illustrate the step S2-3 to stick a transfer film with adhesives to the spacer.

The adhesive 12 is applied to the spacers 6 by the steps S2-1 to S2-4, which are shown in FIGS. 6, 7A, 7B and 8. In the step S2-1, a transfer film 16 is laid on a flat work table 15, as shown in FIG. 7A. The work table 15 is made of glass with high flatness, for instance. The transfer film 16, used as a transfer member, is laid on the working table 15 by air suction or electrostatic chuck, such that the transfer film 16 neither have wrinkles nor shift the position on the working table 15.

The transfer film 16 is a flat and thin film that is made of polyethylene terephthalate (PET). The transfer film 16 has a shape larger than the glass substrate 10. A coating bar 17 for bar coater applies the adhesive 12 uniformly on the transfer film 16 on the working table 15. The thickness T1 of the adhesive 12 on the transfer film 16 is 6 μm to 10 μm, preferably 8 μm. It is possible to utilize other type of coater, such as a blade coater and a spin coater.

It is known that an optical room-temperature activated adhesive is not good in wettability to an inorganic material (such as silicon) used as the spacer 6, and that the wettability improves by increasing the viscosity. An adhesive with high viscosity, however, makes it difficult to control the thickness in application to the spacer 6. Thus, the manufacture process according to the embodiment includes a step S2-2 to leave the transfer film 16 for a predetermined time after the adhesive 12 is applied, so the viscosity of the adhesive 12 increases. In this step S2-2, the temperature and the predetermined time are adjusted such that the viscosity of the adhesive 12 increases to V2, for transfer to the spacer 6, from V1 that is the initial viscosity at the time of application to the transfer film 16. The viscosity V2 is 100 Pa·s to 10000 Pa·s, for instance, and preferably about 2000 Pa·s to about 3000 Pa·s.

By using the adhesive 12 with low viscosity at the time of application to the transfer film 16, and by increasing the viscosity for transferring the adhesive 12 to the spacer, it is possible to control the thickness of the adhesive 12 precisely while keeping a high wettability to the spacer 6. Since the adhesive 12 with high viscosity does not flow easily, it is possible to handle the transfer film 16, and the glass substrate 10 easily after transfer of the adhesive 12. Moreover, if the adhesive 12 has high viscosity, it is possible to reduce the amount of the adhesive 12 squeezed out of the spacer 6 in bonding the spacers 6 onto the wafer 26.

In the event that the adhesive 12 is hydrophilic, the spacer 6 may improve its wettability to the adhesive 12 by surface modification, such as application of plasma or ultraviolet rays.

Figure 7B:
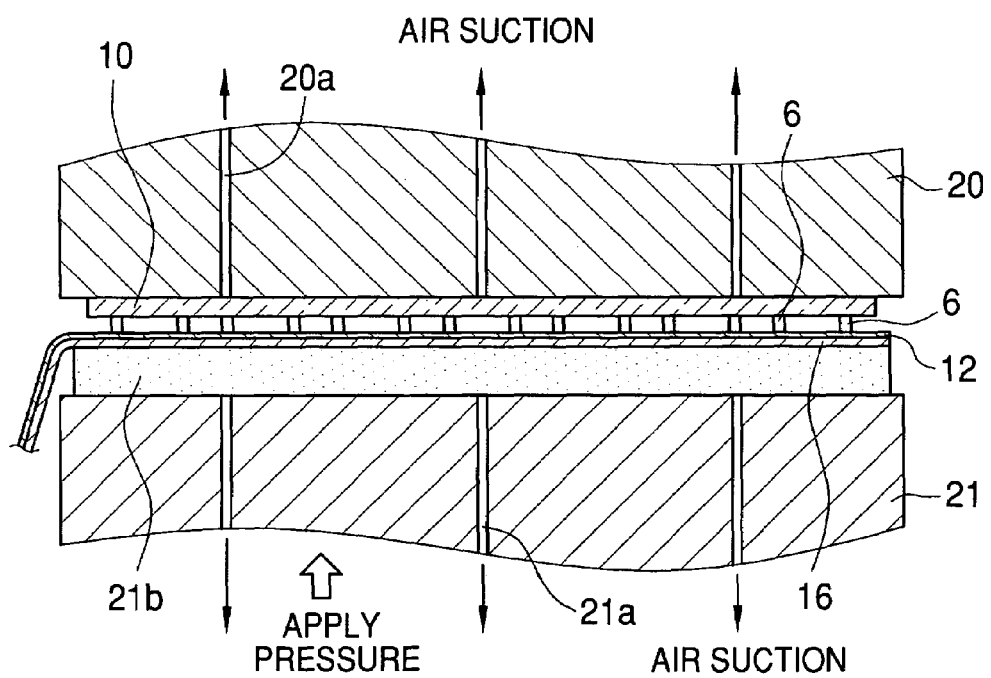

In the step S2-3, the glass substrate 10 is glued to the transfer film 16 by hand or by use of an alignment equipment. An example of the alignment equipment is depicted in FIG. 7B. The alignment equipment comprises a glass holder table 20 and a film holder table 21. The glass holder table 20 holds the glass substrate 10 by air suction through suction holes 20a. The film holder table 21 holds the transfer film 16 via a sponge 21b by air suction from suction holes 21a. The film holder table 21 is moveable up and down (vertical direction in the drawing) in the same manner as a well-known Z-axis movement table.

The film holder table 21 holds the transfer film 16 on the sponge 21b after application of the adhesive 12, and moves upward to uniformly press the transfer film 16 onto the spacers 6 that is formed on the glass substrate 10. The sponge 21b needs to have enough strength to press the transfer film 16 firmly onto the spacer 6 without breaking the spacer 6. Thereby, the glass substrate 10 is glued to the transfer film 16 since the film holder table 21 ensures the spacer 6 to contact to the adhesive 12 on the transfer film 16. The glass substrate 10 may be glued to the transfer film 16 by moving a pressure roller on the glass substrate 10.

Figure 8:
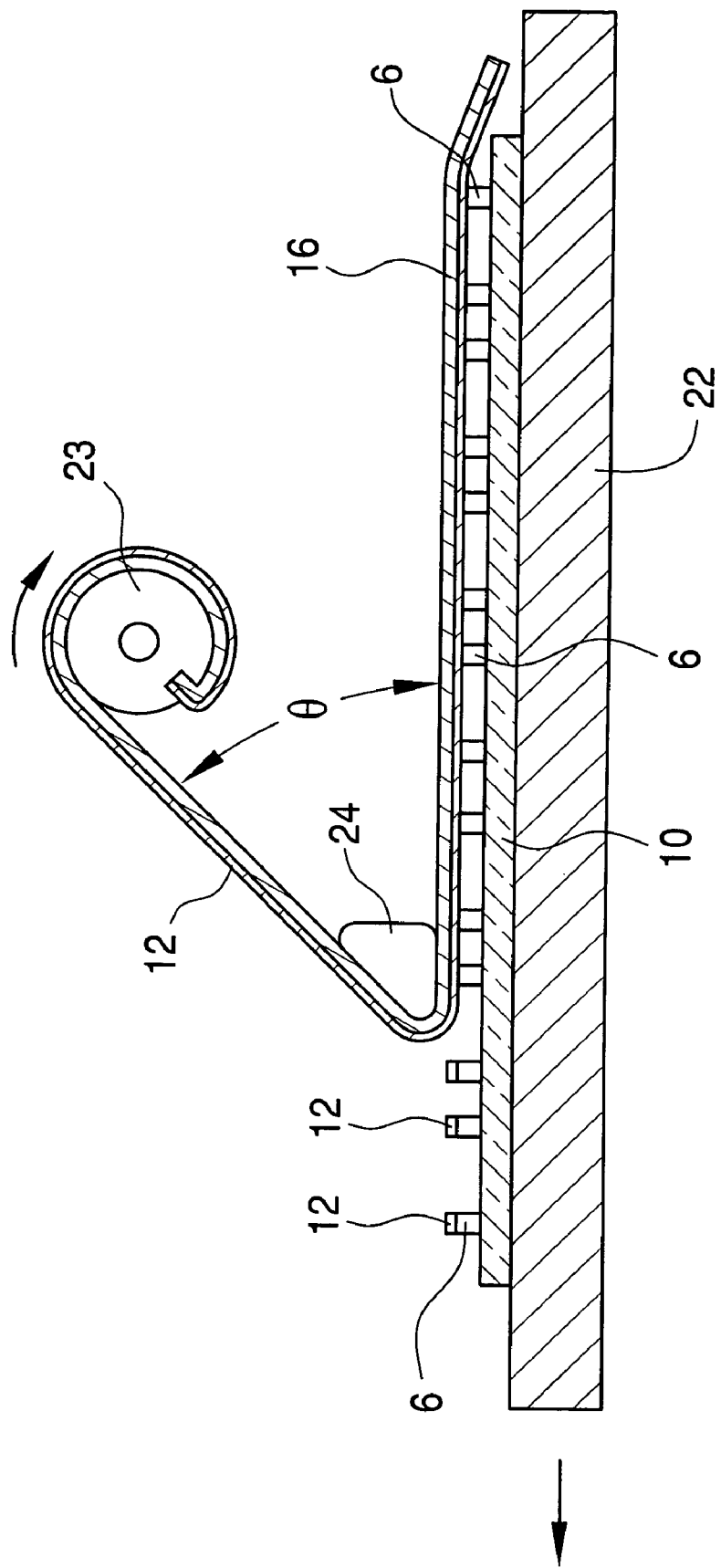
FIG. 8 is an explanatory view to illustrate the step S2-4 to peel the transfer film from the spacer.

During the step S2-4, the transfer film 16 is peeled off, and thereby, the adhesives 12 are transferred to the spacers 6. As shown in FIG. 8, a film peeling equipment used in this step comprises a working table 22, a winding roller 23 and a peeling guide 24. The working table 22 to hold the glass substrate 10 by air suction, for instance, is slidable horizontally by a table moving mechanism used for a well-known XY table. One end of the transfer film 16 is fixed to the winding roller 23. The peeling guide 24 comes in contact with the upper surface of the transfer film 16, and keeps the angle θ between the transfer film 16 and the glass film 10 constant.

The film peeling equipment starts to drive the winding roller 23 to wind the transfer film 16 at the same time as sliding the working table 22 to leftward in the drawing. Thereby, the transfer film 16 is peeled off from one end of the glass substrate 10. Since the shape of the rear surface of the transfer film 16 is regulated by the peeling guide, the angle θ between the transfer film 16 and the glass film 10 becomes constant. Thus, the thickness of the transferred adhesive 12 becomes uniform. If the transfer film 16 is not large enough to engage the winding roller 23, an extension film is attached to one end of the transfer film 16 such that the transfer film 16 is fixed to the winding roller 23.

Figure 10:
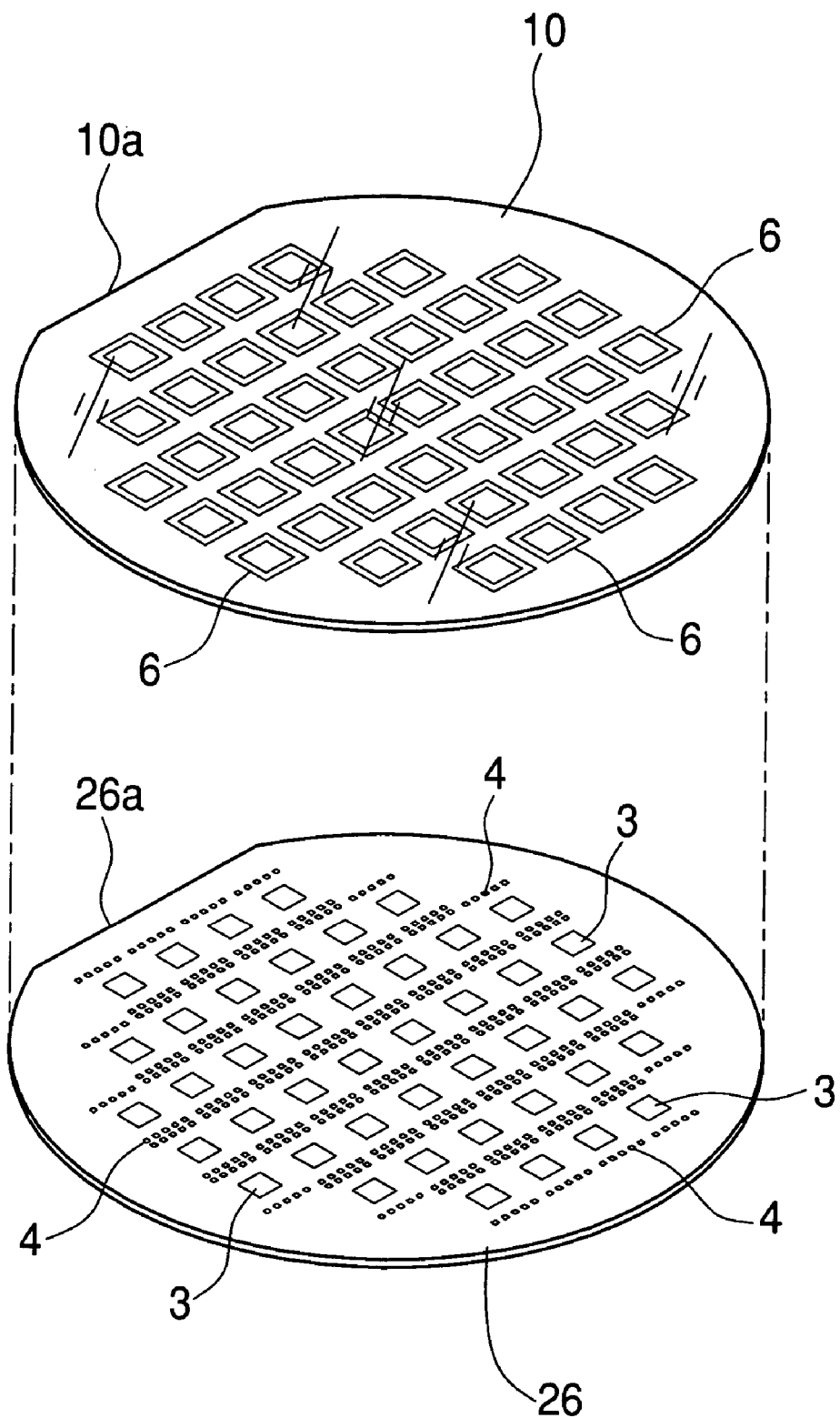
FIG. 10 is a perspective view of the glass substrate and the wafer.

In the third step S3, the glass substrate 10 is bonded to the wafer 26 on which plural solid-state imaging elements 3 and the connecting terminals 4 are formed, as shown in FIG. 9A. Note that the glass substrate 10 and the wafer 26 have the same size and shape (see FIG. 10). An alignment bonding equipment, used for bonding the glass substrate 10 to the wafer 26, comprises a bonding table 28 and positioning table 29. The bonding table 28 holds and positions the wafer 26 by air suction through air suction holes 28a. The positioning table 29 holds the glass substrate 10 by air suction through air suction holes 29a, and adjusts the position of the glass substrate 10 in the XY direction (horizontal direction) and the angle to fit the position and angle of the wafer 26.

The positioning table 29 adjusts the position of the glass substrate 10 by use of orientation flat lines 26a, 10a of the wafer 26 and the glass substrate 10, and alignment marks that are properly formed in the wafer 26 and the glass substrate 10. After positioning, the positioning table 29 moves downward to stick the glass substrate 10 on the wafer 26. Then, pressure is applied to the whole surface of the glass substrate 10 at a relatively weak pressure so that the glass substrate 10 is provisionally bonded to the wafer 26. Note that the alignment bonding equipment for provisional bonding does not have the sponge used for the alignment equipment (see FIG. 7B), because the spacer 6 needs to be precisely positioned with respect to the solid-state imaging element 3 in bonding the glass substrate 10 to the wafer 26.

After provisional bonding by use of the alignment bonding equipment, the wafer 26 with the glass substrate 10 is transferred to a pressure bonding equipment, as shown in FIG. 9B. The pressure bonding equipment comprises a bonding table 30 and a pressure table 33. The bonding table 30 holds the wafer 26 and the glass substrate 10 at a predetermined position by air suction through air suction holes 30a. The pressure table 33, provided above the bonding table 30, presses the glass substrate 10 at a predetermined uniform pressure via a sponge 33a. In order to ensure firm bonding, the pressure bonding equipment presses the glass substrate 10 and the wafer 26 for a predetermined time until the adhesive 12 is activated.

The width W of the framed portion of the spacer 6 affects the strength and the condition in bonding between the spacer 6 and the wafer 26, as well as the strength of the spacer 6 itself. If the width W of the spacer 6 is too large, an improper bonding tends to happen because of air remaining inside the adhesive 12. Moreover, since the spacer 6 becomes larger, it is difficult to decrease the size of the solid-state imaging device 2. Thus, the manufacture cost will increase because of the small number of solid-state imaging devices 2 per wafer 26. On the other hand, making the width W of the spacer 6 narrow will decrease the physical strength of the spacer 6 and the bonding strength between the spacer 6 and the wafer 26.

In this embodiment, the width W of the spacer 6 is appropriately selected within the range from 100 μm to 500 μm, in accordance with the size of the solid-state imaging element 3. For instance, if the solid-state imaging element 3 is 1/7 inch in size, the solid-state imaging device 2 is designed such that the width W of the spacer 6 is 200 μm. Thereby, it is possible to increase the strength of the spacer 6, to prevent improper bonding and not to decrease the number of the spacers 6.

As shown in the enlarged portion in FIG. 2, the adhesive 12 is partially flowed out from the spacer 6 when the glass substrate 10 is pressed onto the wafer 26 by use of the pressure bonding equipment. If the amount of flowed adhesive 12 is large enough to reach the solid-state imaging element 3, such adhesive 12 will generate noise interference in the operation of the solid-state imaging device 2. The adhesive 12 according to the embodiment has high viscosity in bonding, so the amount (length from the spacer 6) of the flowed adhesive 12 becomes small. Moreover, since the flowed adhesive 12 is kept to the surrounding area C between the spacer 6 and the solid-state imaging element 3, it is possible to prevent the adhesive 12 from flowing into the solid-state imaging element 3.

If the surrounding area C is too narrow, the adhesive 12 is easily flowed into the solid-state imaging element 3. In addition, the solid-state imaging element 3 will be affected by incident light reflected on the inner surface of the spacer 6, and the stress at the interface between the spacer 6 and the wafer 26. On the other hand, making the surrounding area C too wide is not preferable in terms of productivity and manufacture cost.

The applicant carried out an experiment to analyze the relationship between the viscosity of the adhesive 12 and the amount of flowed adhesive 12. In this experiment, the length of the adhesive from the inner surface of the spacer is measured after bonding the spacer to the wafer. The viscosity of the adhesive is varied in this experiment. As a result, it is found that the length of the flowed adhesive becomes small as the viscosity of the adhesive increases. Especially, the length of the flowed adhesive 12 becomes less than 65 μm when the viscosity V2 of the adhesive 12 at the time of transfer is 100 Pa·s to 10000 Pa·s (preferably, about 2000 Pa·s to about 3000 Pa·s).

Accordingly, designing the width of the surrounding area C within the range from 50 μm to 100 μm, preferably from 65 μm to 80 μm, makes it possible to prevent the adhesive 12 from flowing into the solid-state imaging element 3 while making the solid-state imaging device as small as possible. Moreover, designing the width of the surrounding area C within the above range is effective in getting rid of the influence of reflected incident light and the stress at the interface of the spacer 6.

As shown in the enlarged view in FIG. 2, the thickness T2 of the activated adhesive 12 becomes smaller than the thickness T1 of the adhesive 12 applied to the transfer film 16. This is because the adhesive 12 is partially remained on the transfer film 16 after transferring the adhesive 12 top the spacer 6, and because the adhesive 12 is partially flowed out of the spacer when the spacer 6 is bonded to the wafer 26.

An experiment carried out by the applicant shows that the spacer 6 is firmly bonded on the solid-state imaging element chip 5 without a gap therebetween if the thickness T2 of the activated adhesive 12 is 0.5 μm to 5 μm. Thus, the thickness T1 of the adhesive 12 in transferring to the transfer film 16 need to be determined in consideration of the amount of remained adhesive and flowed adhesive, such that the thickness T2 of the activated adhesive 12 is 0.5 μm to 5 μm.

Figure 11:
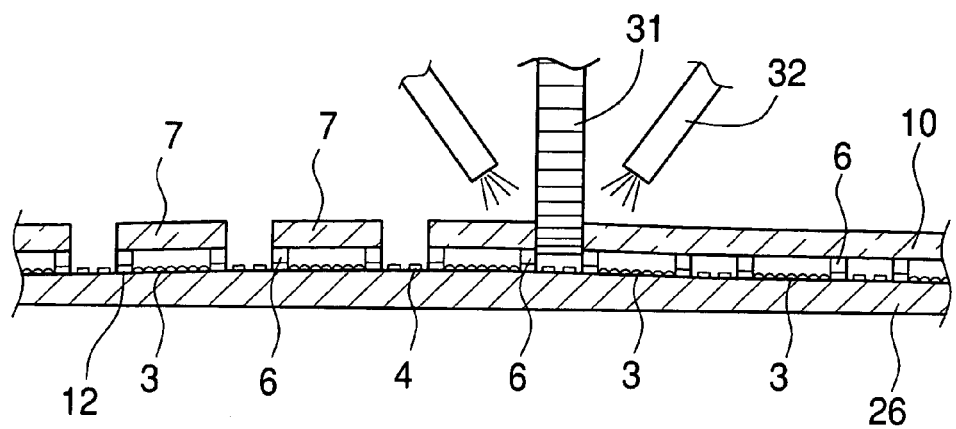
FIG. 11 is a partial cross section according to a glass substrate dicing step S4.

In the fourth step S4, the glass substrate 10 is subject to dicing process by use of a diamond cutter 31 to divide the glass substrate 10 into plural cover glasses 7, as shown in FIG. 11. Cooling water is poured from the nozzles 32 in order to prevent overheating of the diamond cutter 31 and the glass substrate 10. Since the adhesive 12 seals the gap between the spacer 6 and the wafer 26 in water-tight manner, the cooling water does not flow into the spacer 6 during the glass substrate dicing step S4.

Figure 12:
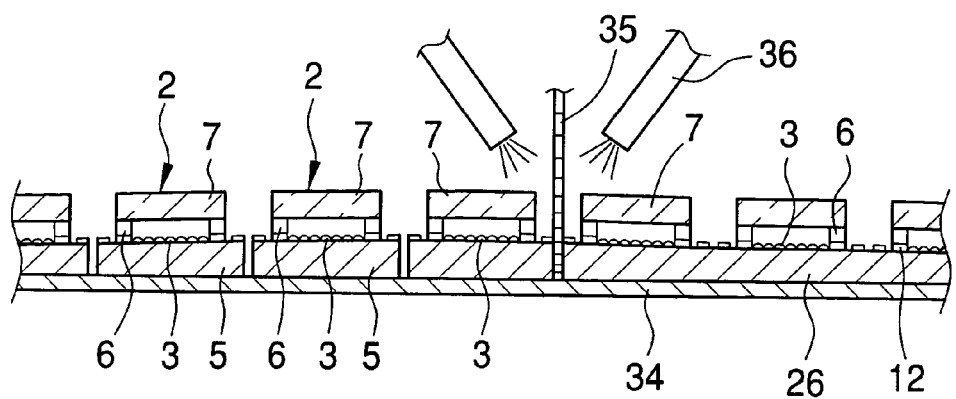
FIG. 12 is a partial cross section according to a wafer dicing step S5.

During the fifth step S5, a dicing tape 34 is glued to the bottom surface of the wafer 26, as shown in FIG. 12. Then, a diamond cutter 35 is actuated to dice the wafer 26 while pouring the cooling water from nozzles 36, and thereby, plural solid-state imaging devices 2 are manufactured. The adhesive 12 between the spacer 6 and the wafer 26 tightly keeps the cooling water from the nozzles 36 from flowing into the spacer 6.

Figure 13A:
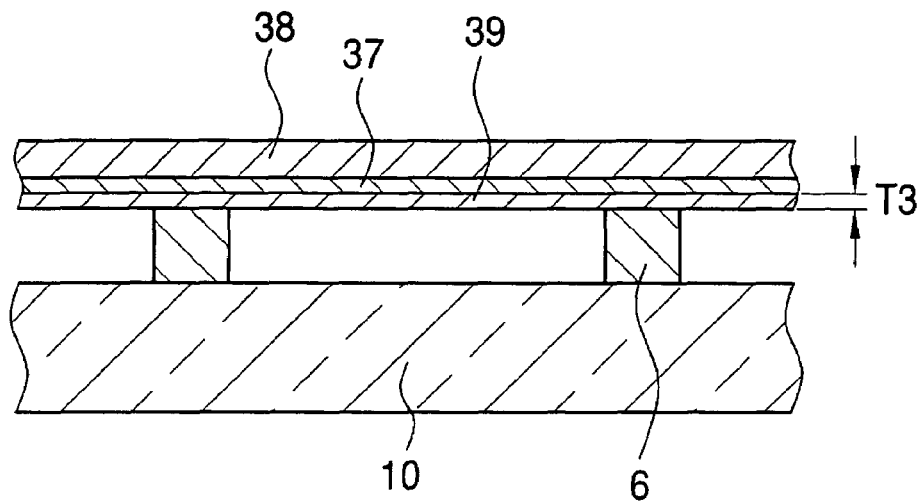
FIGS. 13A and 13B are explanatory views to show the transfer film to be peeled, according to the second embodiment.

Although the transfer member is a flexible plastic film in the above embodiment, a rigid body with high flatness may be used as a transfer plate 38 for transferring the adhesive 39 to the spacer 6, as shown in FIG. 13A. The transfer plate 38 is, for instance, a glass plate. In the event of transferring the adhesive 39 by use of the transfer plate 38, it is necessary to release the transfer plate 38 slowly from the glass substrate 10 for the purpose of ensuring to transfer the adhesive 39 to the spacer 6.

As shown in FIG. 13A, a release agent 37, such as silicon, may be coated on the surface of the transfer plate 38 for the purpose of increasing the peelability of the adhesive 39 from the transfer plate 38. In that case, any type of the adhesive 39 may be used if it is possible to apply the adhesive 39 to the release agent 37, and if the wettability of the adhesive 39 to the spacer 6 is better than that to the release agent 37.

Figure 13B:
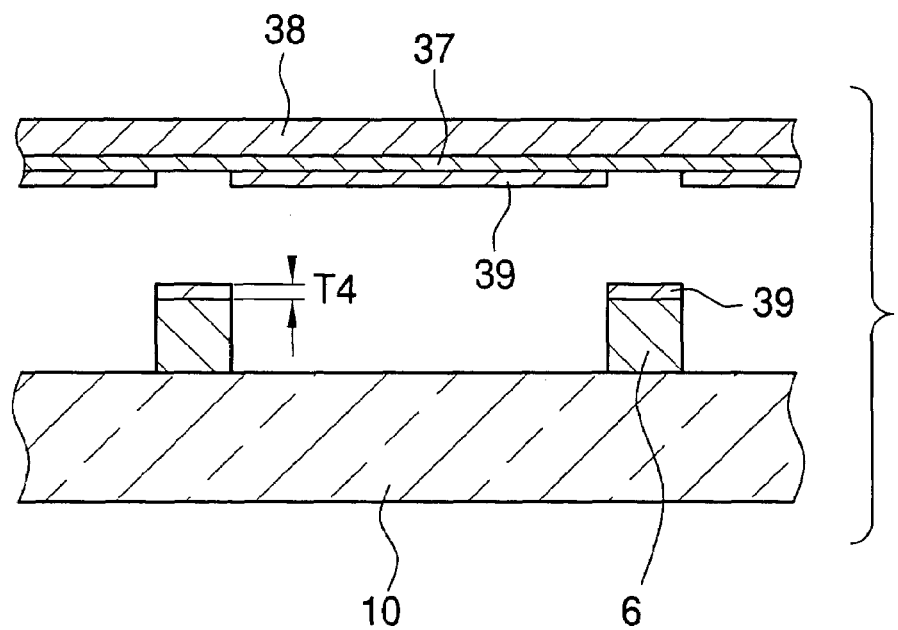

In FIG. 13A, the adhesive 39 is applied to the release agent side of the transfer plate 39. Then, the transfer plate 38 is released from the glass substrate after sticking the transfer plate 38 to the spacer 6, as shown in FIG. 13B. The adhesive 39 on the release agent 37 is completely transferred to the spacer 6 over the area where the adhesive 39 comes in contact with the spacer 6.

The thickness T3 of the adhesive 39 on the transfer plate 38 is the same as the thickness T4 of the adhesive 39 transferred to the spacer 6. Accordingly, the thickness of the adhesive 39 transferred to the spacer 6 is easily controlled by adjusting the thickness of the adhesive 39 applied on the transfer plate 38. The adhesive 39 with high viscosity is preferable. The release agent 37 is also applied to the transfer film 16 as the transfer member. It is also possible to provide a silicon coat film.

Figure 14:
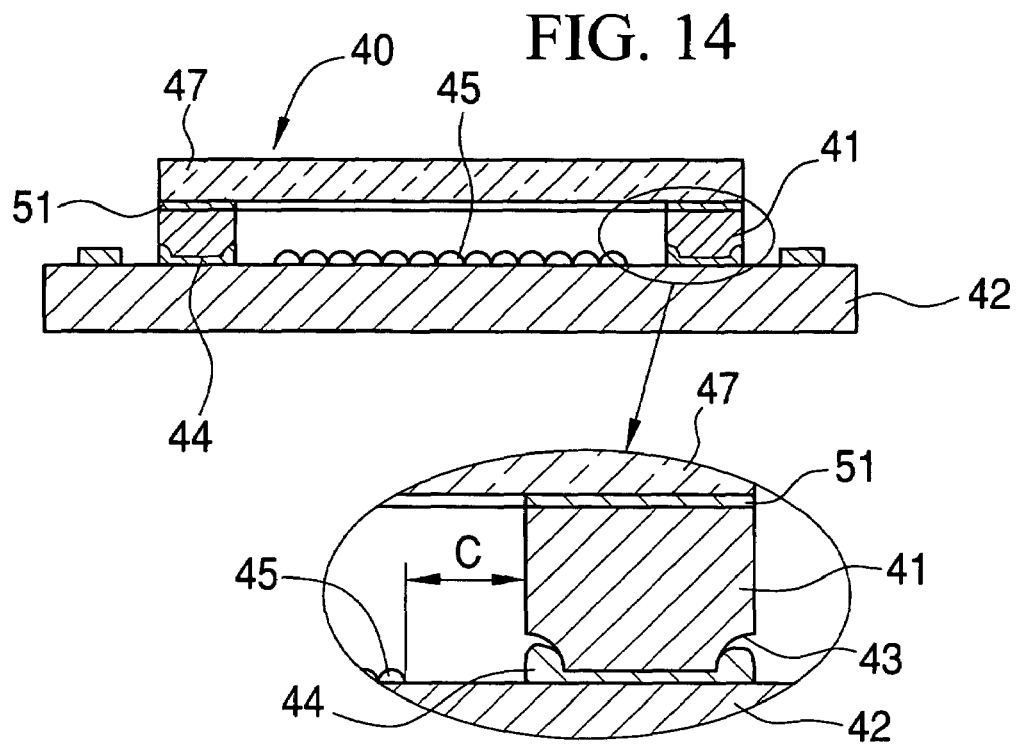
FIG. 14 is a partial cross section of the solid-state imaging device in which the spacer has chamfer edges.

As shown in FIG. 14, the solid-state imaging device 40 may have a spacer 41 in which chamfer edges 43 are formed in the surface to be bonded to the solid-state imaging element chip 42. The space between the chamfer edges 43 and the solid-state imaging element chip 42 can contain the surplus adhesive 44 to be flowed out, so it is possible to reduce the amount of the adhesive 44 to flow toward the solid-state imaging element 45. Accordingly, the surrounding area C between the spacer 41 and the solid-state imaging element 45 is reduced.

Figure 15:
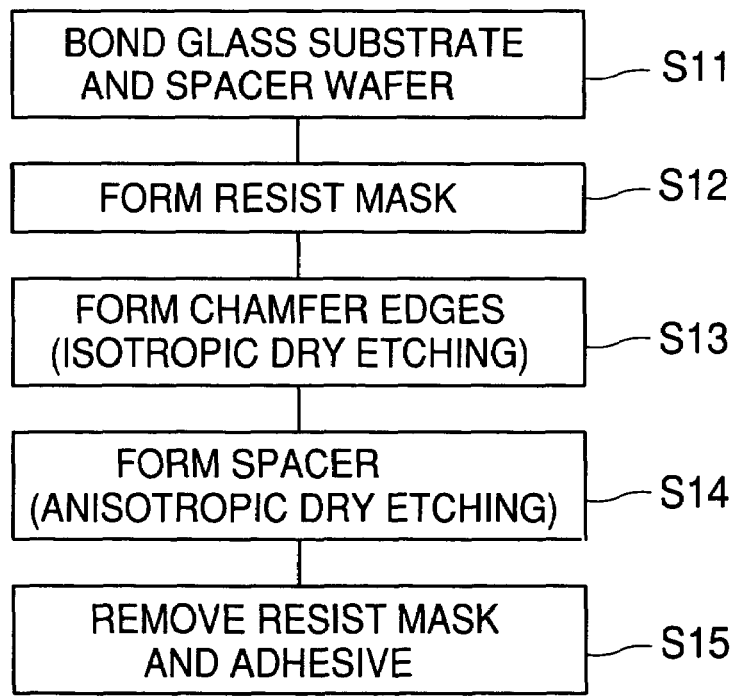
FIG. 15 is a flow chart showing the sequence of forming the chamfer edges in the spacer.
Figure 16A:
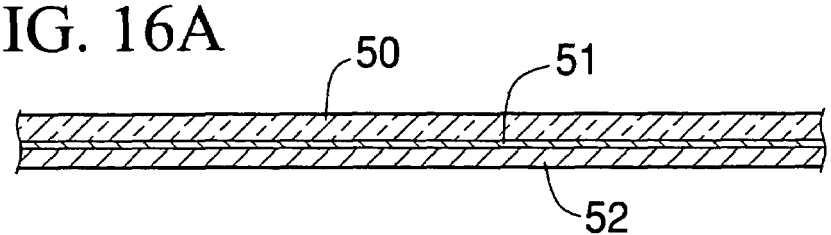
FIGS. 16A to 16E are partial cross sections, with enlarged views, to illustrate the process to form the chamfer edges.
Figure 16B:
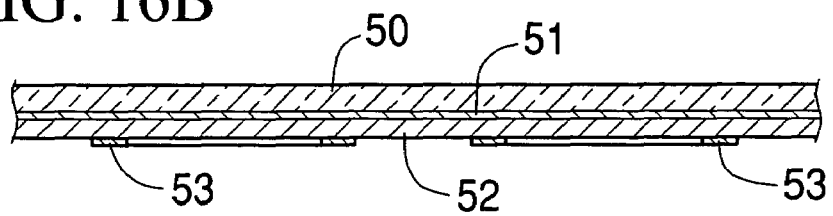

The chamfered edges 43 may be formed according to the steps S11-S15 shown in FIG. 15. In the first step S11, an adhesive 51 is applied on a glass substrate 50 as the base material of the cover glass 47 (see FIG. 16A). The glass substrate 50 is bonded to a spacer wafer 52 as the base material of the spacer 41. In the second step S12, a resist mask 53 is formed on the spacer wafer 52 (see FIG. 16B). The resist mask 53 corresponds to the pattern of the spacers 41.

Figure 16C:
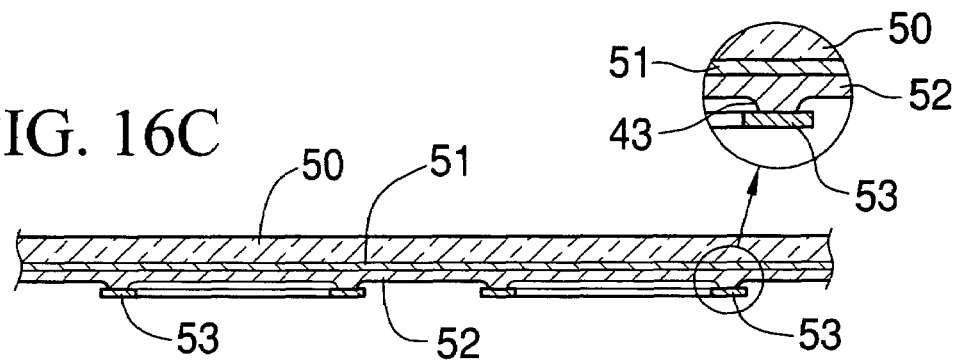
Figure 16D:
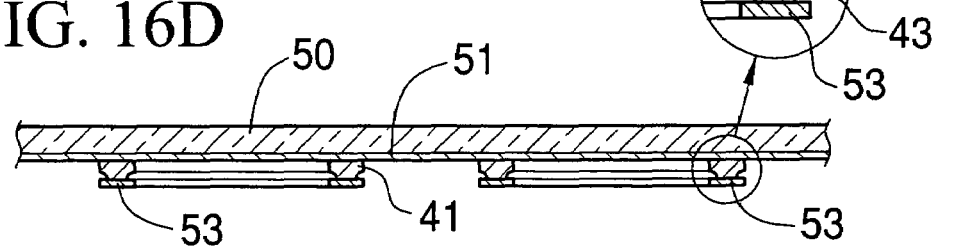
Figure 16E:
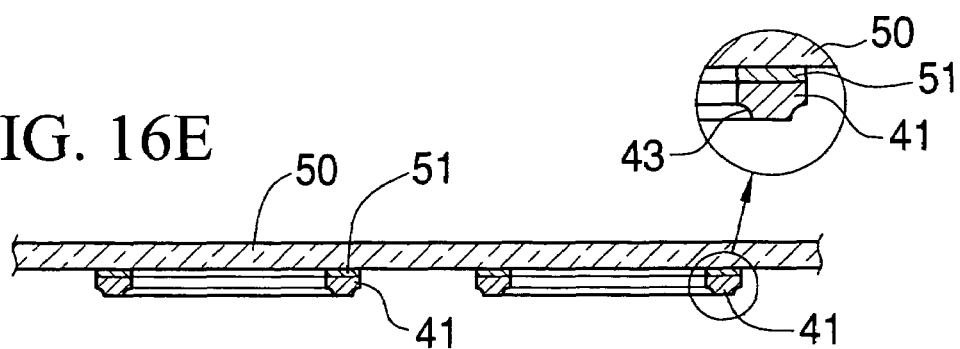
Figure 17A:
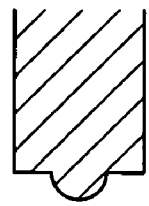
FIGS. 17A to 17F are explanatory views of the chamfer edges of the spacer.
Figure 17B:
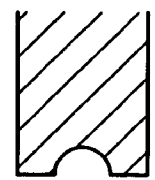
Figure 17C:
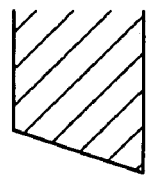
Figure 17D:
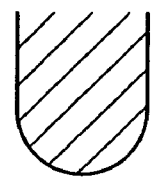
Figure 17E:
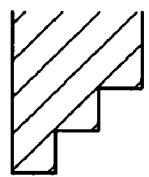
Figure 17F:
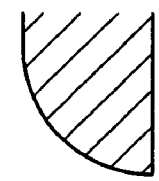

In the third step S13, the spacer wafer 52 is subject to isotropic dry etching to remove the spacer wafer 52 in the area that is not covered by the resist mask 53. Thereby, the chamfer edges 43 are formed underneath the resist mask 53, as shown in FIG. 16C. Then, in the fourth step S14, the spacer wafer 52 is subject to anisotropic dry etching to remove the spacer wafer 52 vertically, as shown in FIG. 16D. In the fifth step S15, the resist mask 53 and the adhesive 51 are removed by ashing process to form the plural spacers 41 on the glass substrate 50 (see FIG. 16D).

Besides the flat edge in FIG. 2 and the chamfer edge in FIG. 14, the spacer may have other edge shapes. Examples of the edge shapes are convex, concave, taper, semi-circle, steps, and quarter circle, as shown in FIGS. 17A-17F. The spacers with these edge shapes can contain the surplus of the adhesive 12, and thus reduces the amount of the adhesive 12 to be flowed toward the solid-state imaging element 45.

Figure 18A:
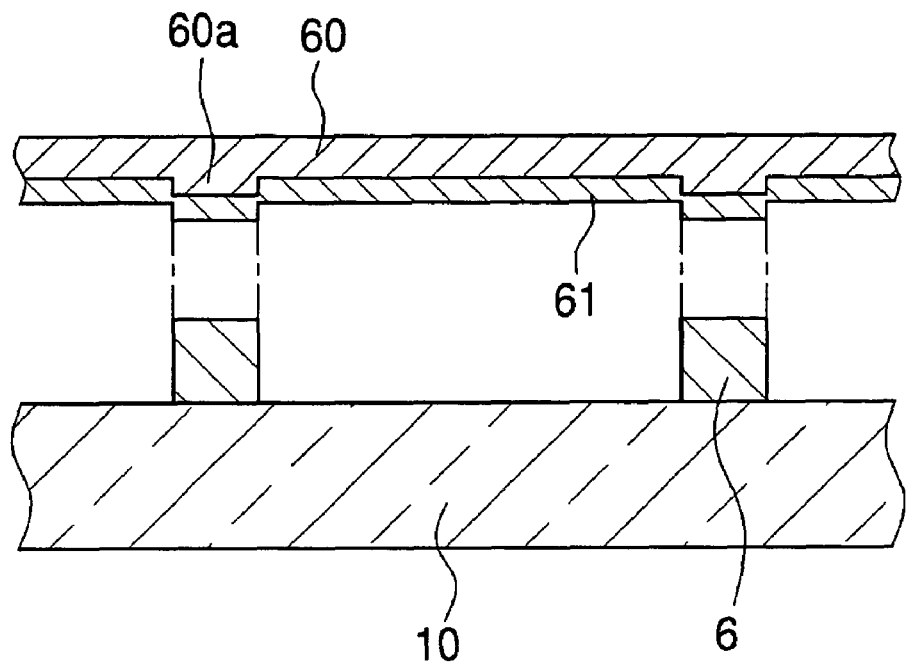
FIG. 18A is an explanatory views of the transfer film and the spacer, in which a recess pattern to fit the spacers is formed in the transfer film.
Figure 18B:
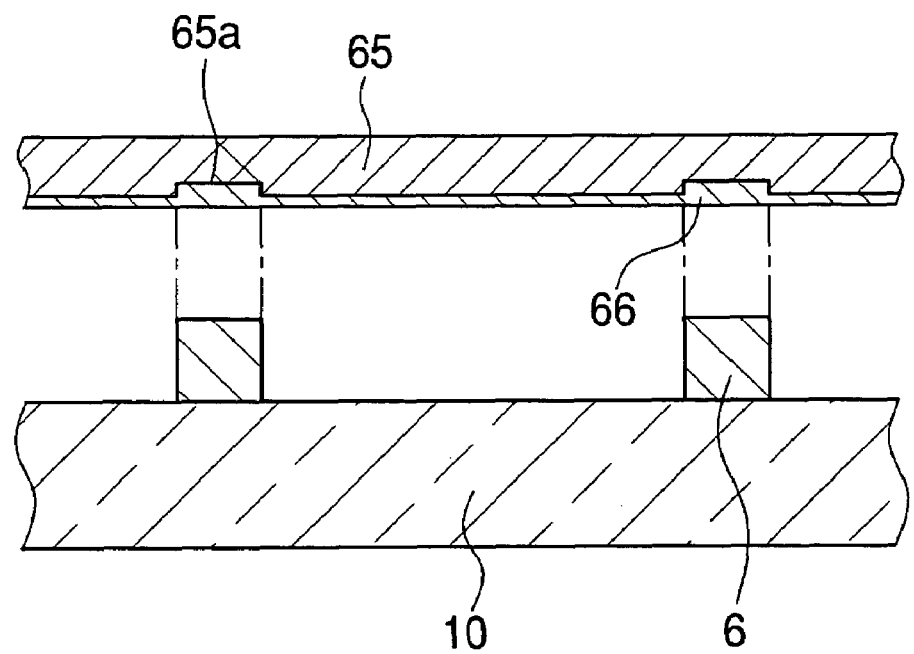
FIG. 18B is an explanatory views of the transfer film and the spacer, in which a hollow pattern to fit the spacers is formed in the transfer film.

As shown in FIG. 18A, a transfer member 60 may have a ridge pattern 60a that fits the spacers 6 formed in the glass substrate 10. An adhesive 61 is applied to the transfer member 60 with the ridge pattern 60a. By forming the ridge pattern 60a, it is possible to ensure the contact of the transfer member 60 to the spacer 6. Alternatively, a transfer member 65 may have recess pattern 65a that first the spacers 6, as shown in FIG. 18B. An adhesive 66 is applied to the transfer member 65 with the ridge pattern 65a. It is possible to adjust the amount of the adhesive 66 by controlling the depth of the recess pattern 65a. An elastic body like a flexible film and a rigid body like a glass plate may be used as the transfer member 60, 65.

The CCD type solid-state imaging device is described in the above embodiment, a CMOS type solid-state imaging device is applied to the present invention. The present invention is also applicable to bonding a substrate to manufacture a chip with CSP structure other than the solid-state imaging device.

Various changes and modifications are possible in the present invention and may be understood to be within the scope of the present invention.

What is claimed is:

1. A method for manufacturing a solid-state imaging device by adhering a transparent substrate, in which a plurality of frame-shaped spacers are formed, via an adhesive to a wafer on which plural solid-state imaging elements are formed, and by dividing the transparent substrate and the wafer for each solid-state imaging element, each of the solid-state imaging elements on the wafer being surrounded by each of the plurality of spacers, the method comprising the steps of:
    adhering a transfer member, to which the adhesive is applied, to the plurality of spacers formed on the transparent substrate;
    applying pressure to the transparent substrate and the transfer member, which is adhered to the plurality of spacers formed on the transparent substrate; and
    releasing the transfer member from the transparent substrate to transfer the adhesive, which is applied to the transfer member, from the transfer member onto the plurality of spacers formed on the transparent substrate.

2. The method according to claim 1, wherein the transfer member is a rigid body.

3. The method according to claim 2, wherein the transfer member is a glass plate.

4. The method according to claim 1, wherein the transfer member is an elastic body.

5. The method according to claim 4, wherein the transfer member is a flexible plastic film.

6. The method according to claim 5, wherein the transfer member is peeled off such that the angle between the transfer member and the transparent substrate is kept constant.

7. The method according to claim 1, further comprising the step of forming a ridge pattern or a recess pattern in the transfer member, the ridge pattern or the recess pattern being the same pattern as the spacers in the transparent substrate.

8. The method according to claim 1, further comprising the step of applying a release agent on the surface of the transfer member.

9. The method according to claim 8, wherein the release agent is silicon.

10. The method according to claim 1, further comprising the step of carrying out surface modification to the surface of the spacer to which the adhesive is applied.

11. The method according to claim 1, wherein the viscosity of the adhesive is 0.1 Pa·S or more when the adhesive is applied to the transfer member.

12. The method according to claim 1, wherein the adhesive is applied to the transfer member by bar coating, blade coating or spin coating.

13. The method according to claim 1, wherein pressure is applied to the transfer member and the transparent substrate by air pressure or roller pressure.

14. The method according to claim 1, wherein the viscosity of the adhesive is 100 Pa·S to 10000 Pa·S when the adhesive is transferred to the spacer from the transfer member.

15. The method according to claim 1, wherein the adhesive has the thickness from 0.5 µm to 5.0 µm after the adhesive is activated.

16. The method according to claim 1, wherein the spacer is bonded to the wafer over the surface to which the adhesive is applied.

17. The method according to claim 1, further comprising the step of bonding the wafer to the transparent substrate by pressing the wafer and the plurality of spacers formed on the transparent substrate, wherein the adhesive transferred from the transfer member onto the plurality of spacers bonds the plurality of spacers to the wafer.

* * * * *